(12) United States Patent
Egusa et al.

(10) Patent No.: US 9,979,105 B2
(45) Date of Patent: May 22, 2018

(54) POWER SEMICONDUCTOR DEVICE

(71) Applicant: Mitsubishi Electric Corporation, Tokyo (JP)

(72) Inventors: Minoru Egusa, Tokyo (JP); Hidetoshi Ishibashi, Tokyo (JP); Yoshitaka Otsubo, Tokyo (JP); Hiroyuki Masumoto, Tokyo (JP); Hiroshi Kawata, Hyogo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days. days.

(21) Appl. No.: 15/145,056

(22) Filed: May 3, 2016

(65) Prior Publication Data
US 2016/0336245 A1 Nov. 17, 2016

(30) Foreign Application Priority Data

May 15, 2015 (JP) .................................. 2015-099617
Mar. 11, 2016 (JP) .................................. 2016-047789

(51) Int. Cl.
*H01R 12/58* (2011.01)
*H01L 23/053* (2006.01)

(52) U.S. Cl.
CPC ......... *H01R 12/585* (2013.01); *H01L 23/053* (2013.01); *H01L 2224/48137* (2013.01); *H01L 2224/73265* (2013.01); *H01L 2924/19107* (2013.01)

(58) Field of Classification Search
CPC .................................................. H01R 12/585
See application file for complete search history.

(56) References Cited

U.S. PATENT DOCUMENTS

| | | | | |
|---|---|---|---|---|
| 6,312,296 B1 * | 11/2001 | Jones | ................... | H01R 12/585 439/733.1 |
| 7,780,483 B1 * | 8/2010 | Ravlich | ............... | H01R 12/585 439/751 |
| 2011/0256749 A1 * | 10/2011 | Bayerer | ............... | H01R 12/585 439/345 |
| 2012/0115339 A1 | 5/2012 | Schaarschmidt et al. | | |
| 2012/0190242 A1 | 7/2012 | Kataoka et al. | | |
| 2015/0011114 A1 * | 1/2015 | Endo | ..................... | H01R 13/58 439/449 |

(Continued)

FOREIGN PATENT DOCUMENTS

CN 2458767 Y 11/2001
CN 102222823 A 10/2011

(Continued)

OTHER PUBLICATIONS

An Office Action issued by the Chinese Patent Office (SIPO) dated Feb. 27, 2018, which corresponds to Chinese Patent Application No. 201610320016.X and is related to U.S. Appl. No. 15/145,056; with English language translation.

*Primary Examiner* — James Harvey
(74) *Attorney, Agent, or Firm* — Studebaker & Brackett PC

(57) ABSTRACT

A power semiconductor device includes: an outer case; at least one press-fit terminal buried in a top surface of the outer case; and a plurality of supporting portions formed so as to protrude from the top surface of the outer case. A top end of the press-fit terminal protrudes more than top surfaces of the supporting portions from the top surface of the outer case.

8 Claims, 13 Drawing Sheets

(56) References Cited

U.S. PATENT DOCUMENTS

| | | | | |
|---|---|---|---|---|
| 2015/0147906 A1* | 5/2015 | Guetig | ............... | H01R 43/16 |
| | | | | 439/497 |
| 2016/0262266 A1* | 9/2016 | Matsumoto | ............ | H01R 12/71 |
| 2016/0315022 A1* | 10/2016 | Egusa | ............... | H01L 23/053 |
| 2016/0336245 A1* | 11/2016 | Egusa | ............... | H01R 12/585 |
| 2016/0365662 A1* | 12/2016 | Kimura | ............... | H01R 12/585 |
| 2017/0194223 A1 | 7/2017 | Egusa et al. | | |

FOREIGN PATENT DOCUMENTS

| | | |
|---|---|---|
| CN | 104283025 A | 1/2015 |
| DE | 20218295 U1 | 4/2003 |
| EP | 2 557 633 A1 | 2/2013 |
| JP | 2012-151063 A | 8/2012 |
| JP | 2012-529731 A | 11/2012 |
| JP | 2013-152966 A | 8/2013 |
| WO | 2011/125747 A1 | 10/2011 |
| WO | 2014/132803 A1 | 9/2014 |

\* cited by examiner

F I G. 6
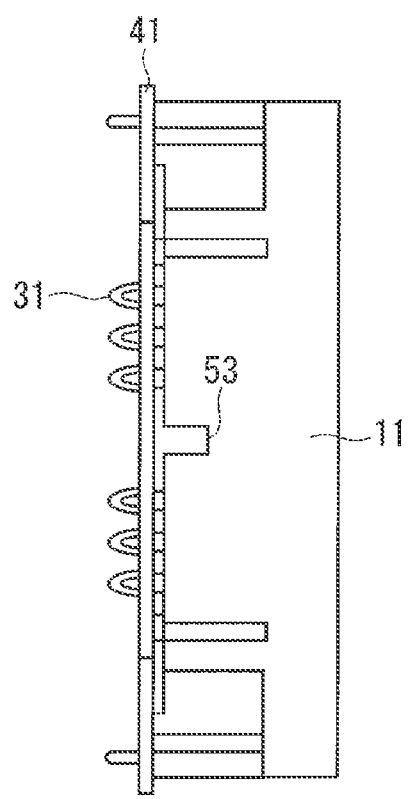

POWER SEMICONDUCTOR DEVICE

BACKGROUND OF THE INVENTION

Field of the Invention

The present invention relates to a power semiconductor device including a press-fit terminal.

Description of the Background Art

Power semiconductor devices among semiconductor devices are used for controlling main power of a wide range of equipment and need high reliability especially in transportation equipment.

The above-mentioned power semiconductor devices include power semiconductor devices including a press-fit terminal (for example, see Japanese Patent Application Laid-Open No. 2013-152966).

Meanwhile, there is a technology for splitting a tip of the press-fit terminal that is inserted (for example, see German Utility Model Specification No. 20218295). With such structure, when the press-fit terminal is inserted into a hole in an external substrate, a split tip is inserted at the start of the insertion and a connected portion of a pair of arm portions having the split tip is inserted in the latter half of the insertion work.

The press-fit terminal is located on a top surface of an outer case of the power semiconductor device. In Japanese Patent Application Laid-Open No. 2013-152966, the top surface of the outer case has a planar shape. Thus, for occurrence of warpage of an external substrate, unintentional mechanical stress may occur in the power semiconductor device when the press-fit terminal is inserted into a hole in the external substrate.

SUMMARY OF THE INVENTION

It is an object of the technology to provide a power semiconductor device capable of suppressing mechanical stress of an external substrate when a press-fit terminal is inserted into a hole in the external substrate.

A power semiconductor device according to one aspect of the technology includes: an outer case; at least one press-fit terminal buried in a top surface of the outer case; and a plurality of supporting portions formed so as to protrude from the top surface of the outer case. A top end of the press-fit terminal protrudes more than top surfaces of the supporting portions from the top surface of the outer case.

The external substrate only contacts the supporting portions on the top surface of the outer case. Thus, the mechanical stress of the external substrate applied to the power semiconductor device can be suppressed when the press-fit terminal is inserted into the hole in the external substrate.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a side view illustrating the structure of the power semiconductor device after the external substrate is mounted;

DESCRIPTION OF THE PREFERRED EMBODIMENT

Figure 1:
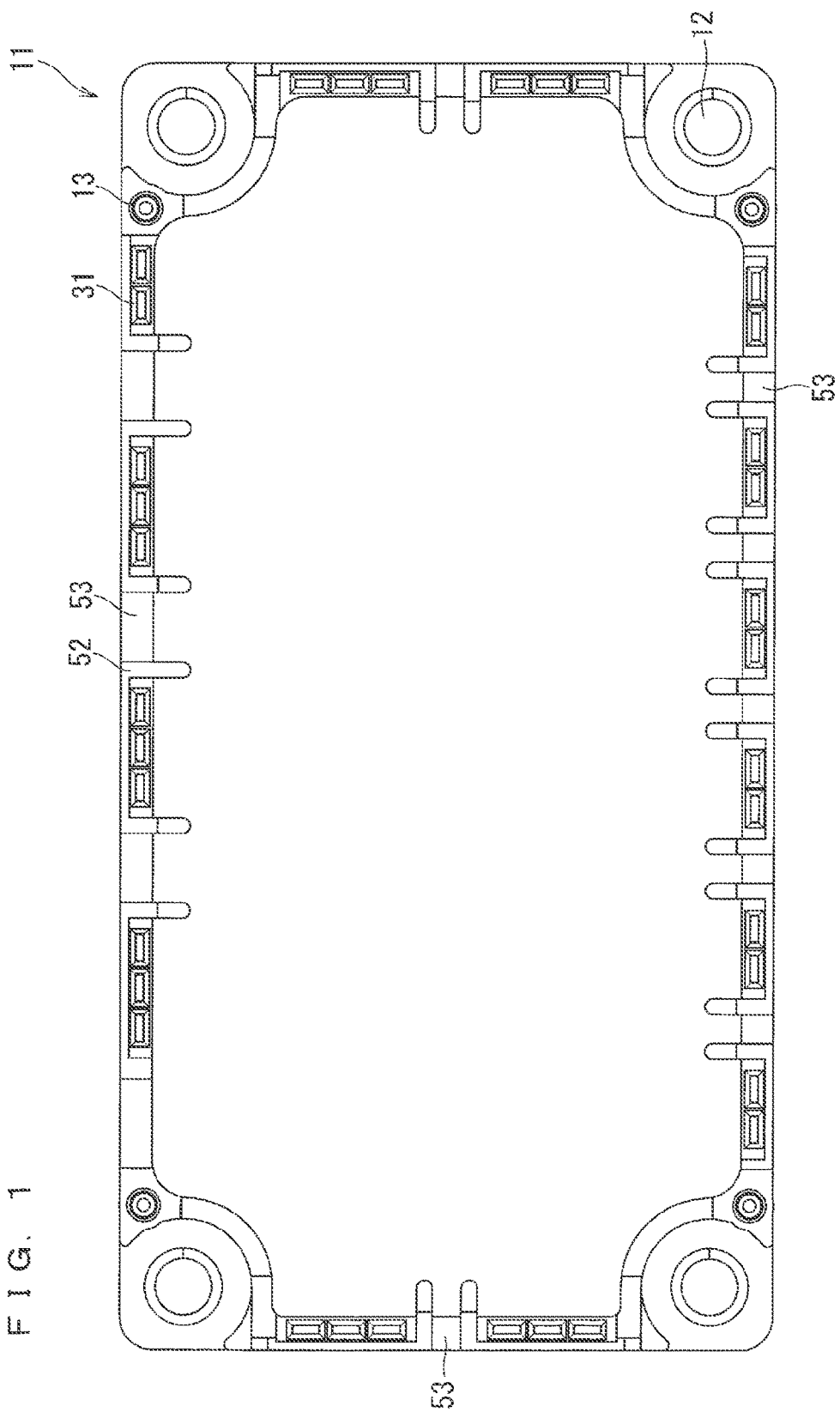
FIG. 1 is a plan view illustrating a structure of a power semiconductor device in a preferred embodiment.

Hereinafter, a preferred embodiment is described with reference to the accompanying diagrams. In addition, the diagrams are schematically shown, and an interrelationship between size and a position of an image shown in each of the different diagrams is not necessarily accurate and may be appropriately modified. In the following description, the same components have the same reference numerals. Their names and functions are also the same. Accordingly, their detailed description will be omitted in some cases.

If terms that refer to specific positions and directions such as "up," "down," "side," "bottom," "front," and "back" are used in the following description, the terms are used for the sake of convenience to facilitate the understanding of the preferred embodiment and are not related to actual directions.

Preferred Embodiment

Configuration

Hereinafter, a power semiconductor device in this preferred embodiment is described.

Figure 2:
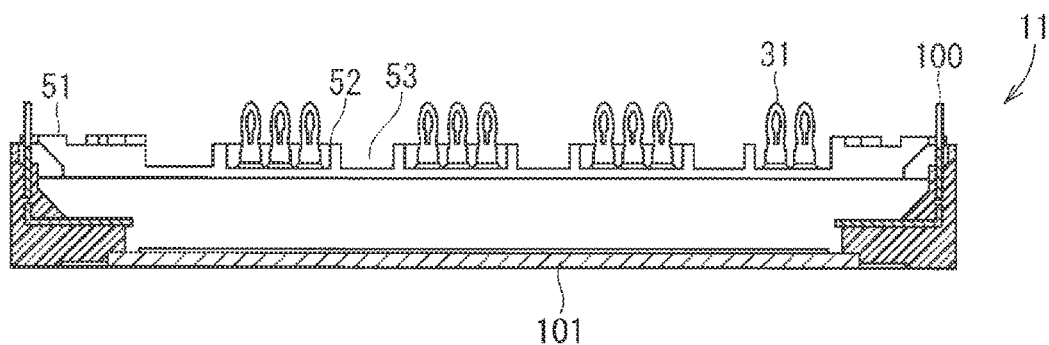
FIG. 2 is a cross-sectional view illustrating the structure of the power semiconductor device in the preferred embodiment.

FIG. 1 is a plan view illustrating the structure of the power semiconductor device in a preferred embodiment. FIG. 2 is a cross-sectional view illustrating the structure of the power semiconductor device in the preferred embodiment.

The power semiconductor device is covered with an outer case 11. The outer case 11 is insert-molded. A material for the outer case 11 is poly phenylene sulfide (namely, PPS) resin, for example. A plurality of mounting holes 12 for mounting a heat sink 101 are formed in the outer case 11. The heat sink 101 is a member for dissipating heat generated when the power semiconductor device is used.

A plurality of press-fit terminals 31 for enabling electrical connection with an external circuit or the like are located on a top surface of the outer case 11. Here, the press-fit terminals refer to terminals held by being inserted into holes without soldering. In FIG. 2, a plurality of screw holes 13 for screwing a mounted external substrate (not illustrated herein) are each formed close to the four corners of the outer case 11 having the integrated tip. For the case illustrated in FIG. 1, the screw holes 13 are formed in the four places in total.

A plurality of terminal protecting portions 52 that at least partially surround the press-fit terminals 31 in plan view and a plurality of substrate supporting portions 51 formed so as to protrude from the top surface of the outer case 11 are located on the top surface of the outer case 11.

The terminal protecting portions 52 are formed so as to protrude from the top surface of the outer case 11, but the substrate supporting portions 51 are formed so as to protrude more than the terminal protecting portions 52.

The substrate supporting portions 51 are each formed close to the four corners of the outer case 11 in the example illustrated in FIG. 2. At least one of the substrate supporting portions 51 is formed in each of the four corners.

Figure 3:
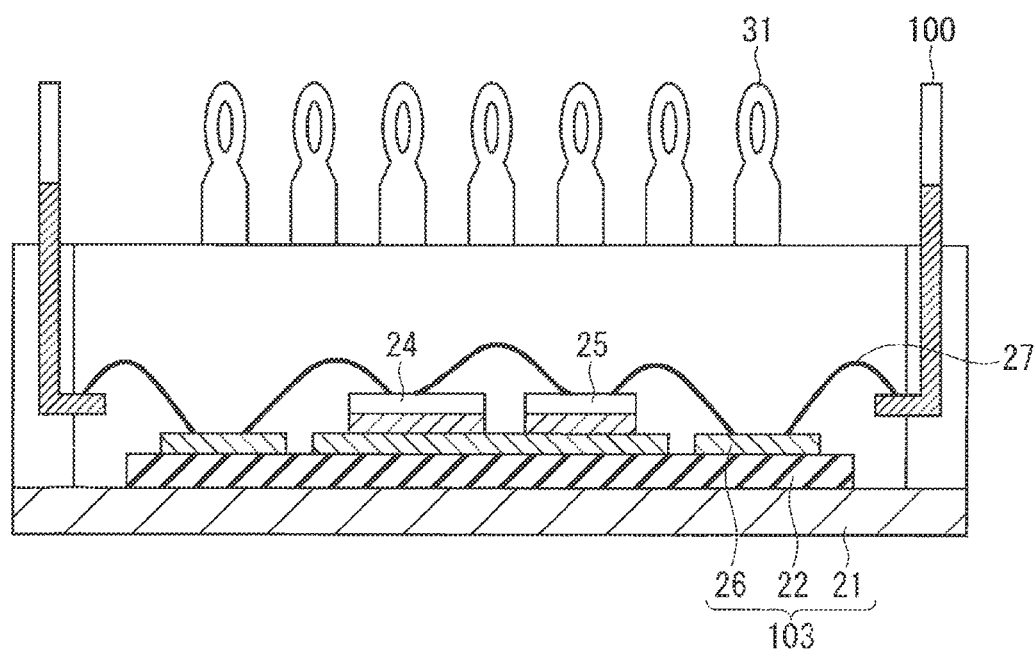
FIG. 3 is a cross-sectional view illustrating an internal structure of the power semiconductor device in the preferred embodiment.

FIG. 3 is a cross-sectional view illustrating an internal structure of the power semiconductor device in this preferred embodiment. Hereinafter, the internal structure of the power semiconductor device is described with reference to FIG. 3. In addition, FIG. 3 illustrates simple structures of the press-fit terminals 31.

A circuit substrate 103 is installed in the power semiconductor device. The circuit substrate 103 includes a copper pattern 26 on a copper base plate 21 with a resin layer 22 as an insulating layer sandwiched therebetween, the copper pattern 26 having a thickness of approximately 500 µm, the copper base plate 21 having a thickness of approximately 2 mm.

Furthermore, an insulated gate bipolar transistor (namely, IGBT) 24 being a power semiconductor element of silicon (Si) is solder-bonded onto part of the copper pattern 26. A free-wheeling diode (FWD) 25 is solder-bonded onto part of the copper pattern 26.

A plurality of aluminum wires 27 having a diameter of approximately 200 µm or greater and 400 µm or less are wire-bonded to the IGBT 24 and the FWD 25. Then, the IGBT 24 is connected to the copper pattern 26 or wire bonding portions (not illustrated herein) of the press-fit terminals 31 with the aluminum wires 27. Similarly, the FWD 25 is connected to the copper pattern 26 or the wire bonding portions of the press-fit terminals 31 with the aluminum wires 27. The copper pattern 26 is further connected to terminals 100.

The outer case 11 is filled with epoxy resin.

Figure 4:
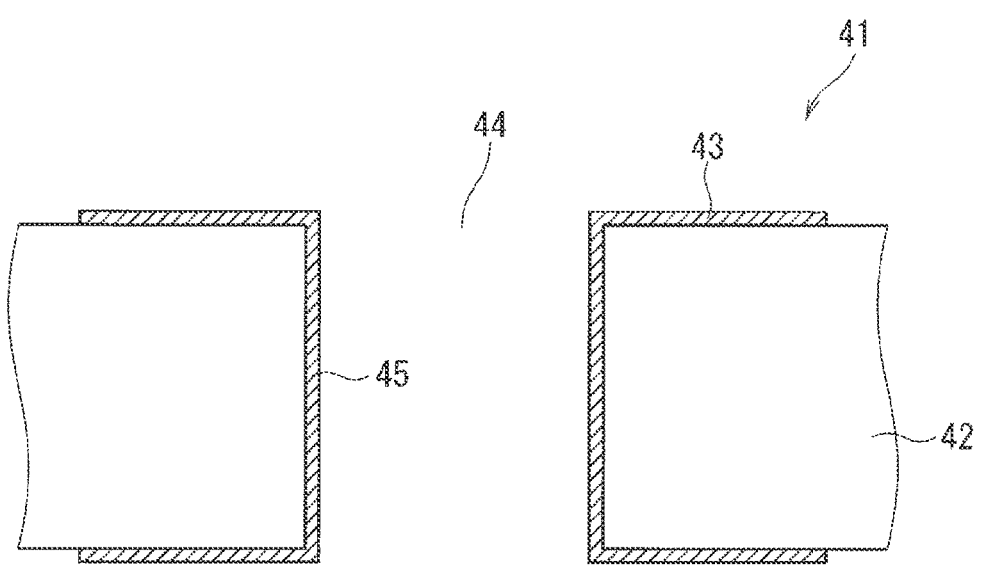
FIG. 4 is an enlarged view schematically showing a cross-sectional shape of an external substrate.

FIG. 4 is an enlarged view schematically showing a cross-sectional shape of the external substrate. The external substrate 41 has a thickness of approximately 1.6 mm (an actual measured value of approximately 1.2 mm or more and 2.0 mm or less). Flame retardant type-4 (FR-4) is used as a base material 42 of the external substrate 41. The external substrate 41 includes circuit patterns 43 on both sides and the inside thereof, so that the external substrate 41 has a total of four layers of the substrate and the circuit patterns 43. FIG. 4 does not show one of the circuit patterns 43 formed inside the substrate.

The circuit patterns 43 have a thickness of approximately 35 µm. It should be noted that the circuit patterns 43 formed on the both sides of the substrate have a thickness of approximately 60 µm or more and 85 µm or less in the end because a thickness of copper plating for coating through holes described later is added.

The through holes 44 are formed in the external substrate 41. The press-fit terminals 31 are inserted into the through holes 44. Copper plating 45 is formed on the inner walls of the through holes 44 that have been surface treated. The copper plating 45 has a thickness of approximately 25 µm or more and 50 µm or less. Electroless Sn plating for preventing oxidation of copper is formed on the copper plating 45. The electroless Sn plating has a thickness of approximately 1 µm. The through holes 44 have a diameter of approximately 2.2 mm.

A part (not illustrated herein) for driving the power semiconductor device is installed on the external substrate 41 before being mounted on the power semiconductor device. Thus, a warp of approximately 200 µm occurs in the external substrate 41, the warp including an initial warp of the external substrate 41 per se or a warp caused by stress generated after the part for driving the power semiconductor device is solder-bonded to the external substrate 41.

Figure 5:
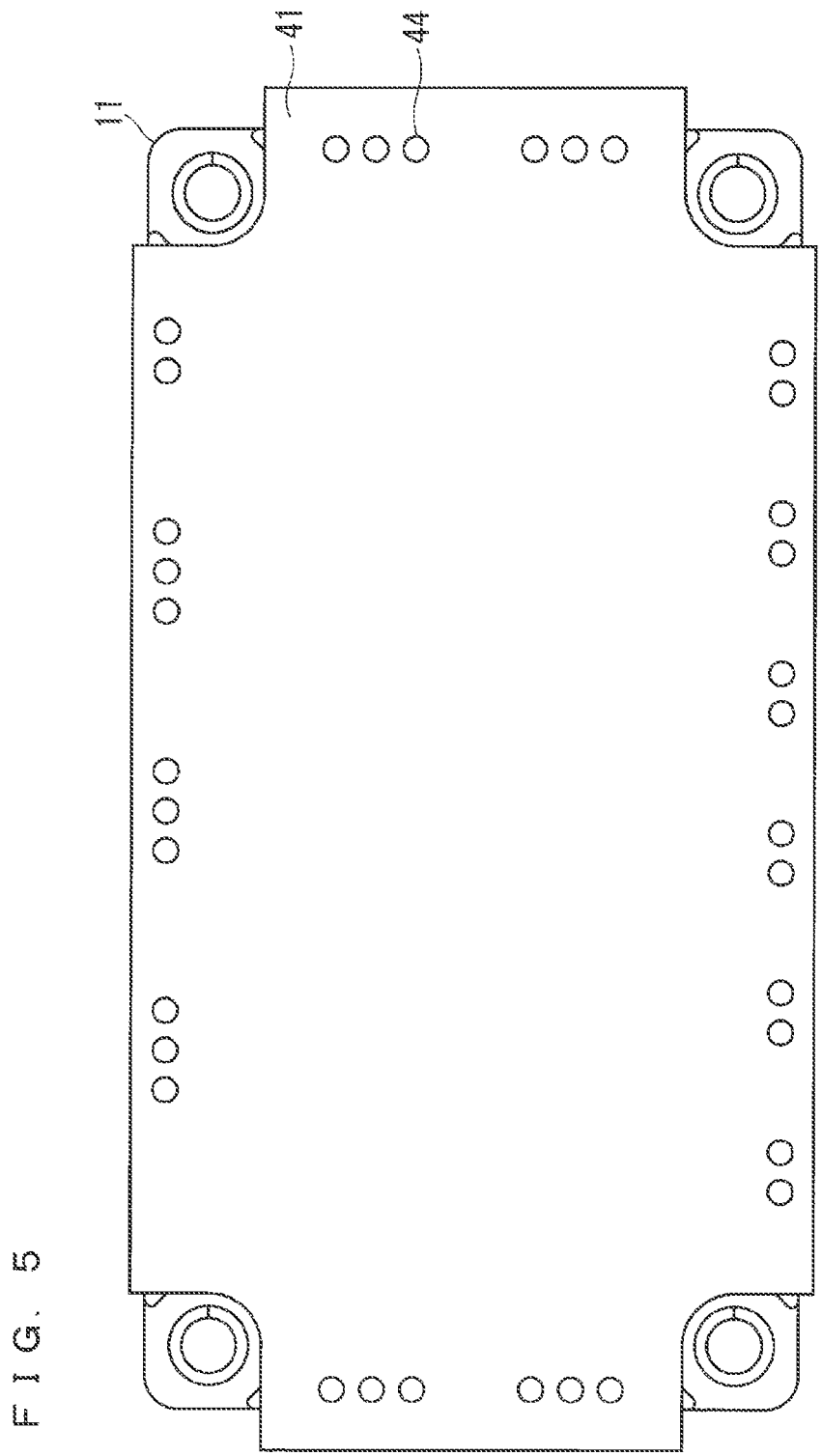
FIG. 5 is a plan view illustrating a structure of the power semiconductor device after the external substrate is mounted.
Figure 7:
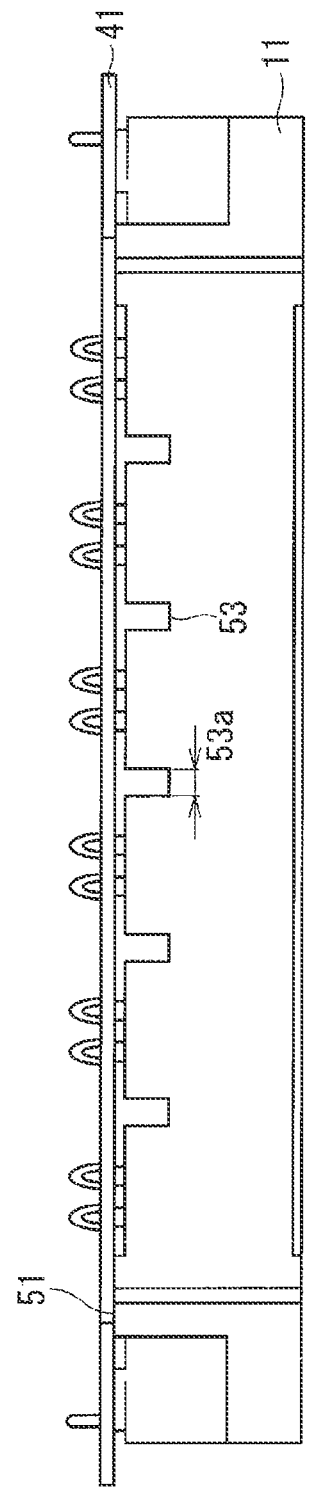
FIG. 7 is a front view illustrating the structure of the power semiconductor device after the external substrate is mounted.

FIG. 5 is a plan view illustrating a structure of the power semiconductor device after the external substrate is mounted. FIG. 6 is a side view illustrating the structure of the power semiconductor device after the external substrate is mounted. FIG. 7 is a front view illustrating the structure of the power semiconductor device after the external substrate is mounted. With reference to FIGS. 5 to 7, mounting of the external substrate on the power semiconductor device is described. FIG. 7 illustrates a plurality of groove portions 53 as the top surface of the outer case 11 and a groove-portion width 53a.

The press-fit terminals 31 of the power semiconductor device are inserted into the through holes 44 in the external substrate 41. Then, the copper plating formed on the inner walls of the through holes 44 or the Sn plating on the outermost surface contacts the press-fit terminals 31, to thereby obtain electrical connection therebetween.

Figure 8:
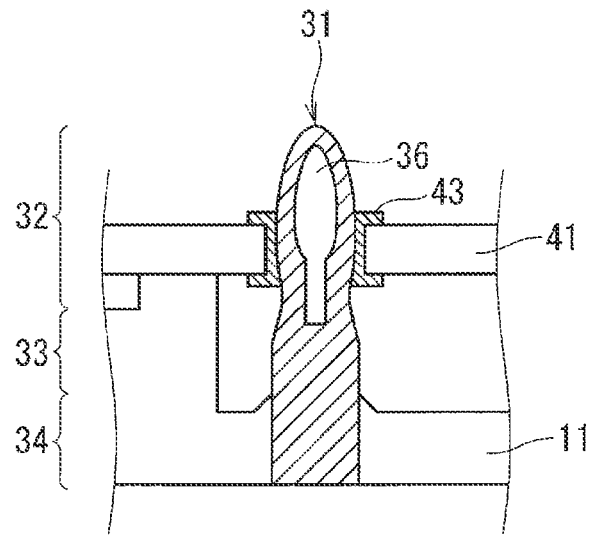
FIG. 8 illustrates a structure of a press-fit terminal while located in an outer case.

Here, the press-fit terminals 31 are described in detail with reference to FIG. 8. FIG. 8 illustrates a structure of one of the press-fit terminals while located in the outer case.

The press-fit terminal 31 has a press-fit portion 32 on the tip side, a body portion 33, a buried portion 34 buried in the outer case 11, and a wire bonding portion 35. The press-fit portion 32 is inserted into one of the through holes 44 in the external substrate 41 to electrically connect the through hole 44 and the press-fit terminal 31.

A surface of the press-fit portion 32 and a surface of the body portion 33 are coated with Ni-base Sn plating that is typically used as electrical contact. The wire bonding portion 35 is coated with the Ni plating to allow for wire bonding by aluminum.

The press-fit portion 32 has a plate thickness of approximately 0.8 mm, and the press-fit portion 32 has a maximum width of approximately 1.15 mm from the center thereof. To properly fix the press-fit terminal 31 to the external substrate 41 by friction after the press-fit terminal 31 is inserted into the through hole 44 in the external substrate 41, the press-fit portion 32 has the width slightly greater than the diameter of the through hole 44.

To enable contact with the inner wall of the through hole 44, the press-fit portion 32 has a shape, which may also be referred to as a needle-eye shape, expanding outwardly and having an opening 36 inside. A cross-sectional shape of the press-fit portion 32 in a plane perpendicular to an insertion direction of the press-fit terminal 31 has four arc-shaped peripheral corners that fit into a cylindrical shape of the inner wall of the through hole 44 so as to increase a contact area.

Figure 9:
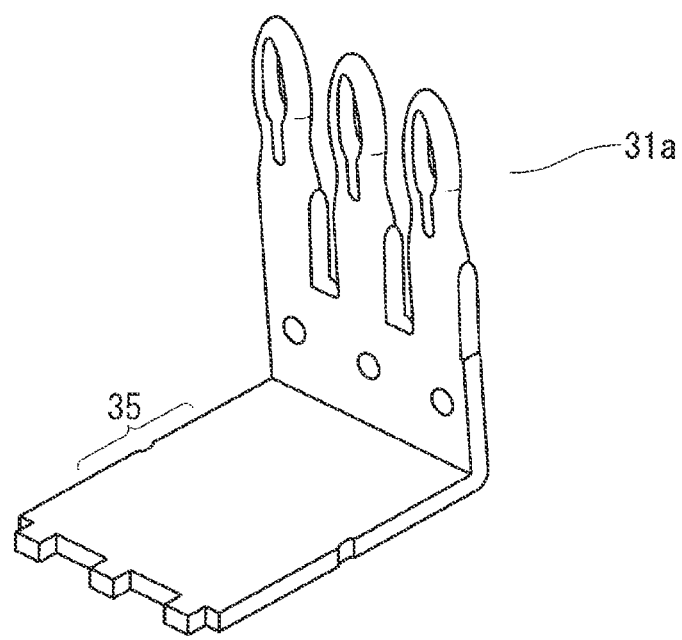
FIG. 9 illustrates a structure in which a plurality of press-fit terminals are integrated.

For a great value of current supplied, a press-fit terminal 31a in which a plurality of press-fit terminals are integrated can be used. FIG. 9 illustrates the structure in which the plurality of press-fit terminals are integrated. Each of the integrated press-fit terminals may be referred to as a "pin."

For the case illustrated in FIG. 9, one pin has an allowable current value of approximately 67 A. Thus, a current of approximately 200 A can pass through three pins that are integrated. Integrating the plurality of pins increases the cross-sectional area of the body portion 33 of each pin, which can suppress a heating value when passing current. Consequently, a temperature rise in the integrated press-fit terminal 31a can be suppressed. A plurality of pins for transmitting signals do not need to be integrated because a current of approximately several A is assumed to pass through one pin.

Figure 10:
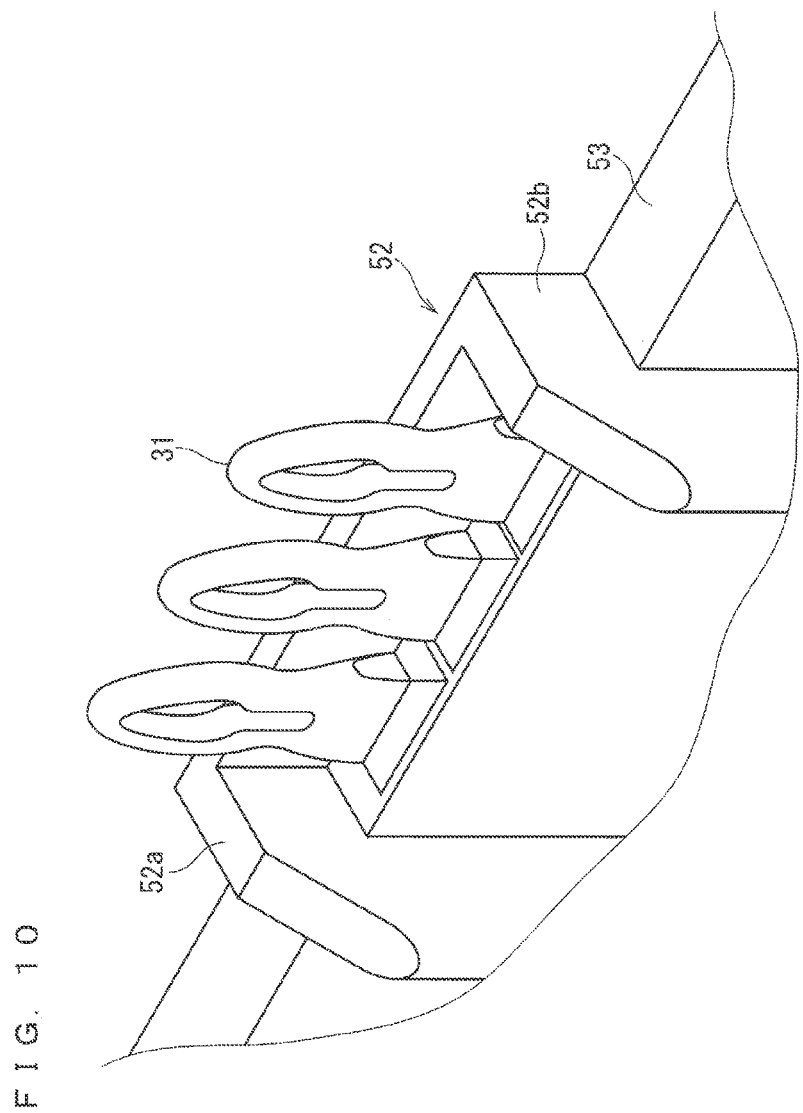
FIG. 10 illustrates a structure of the press-fit terminals on a top surface of the outer case.

FIG. 10 illustrates the structure of the press-fit terminals 31 on the top surface of the outer case 11. As illustrated in FIG. 10, one of the terminal protecting portions 52 has a terminal-protecting-portion top surface 52a and terminal-protecting-portion side walls 52b.

A cross-sectional area of the press-fit portion 32 in the plane perpendicular to the insertion direction of the press-fit terminal 31 is greater on the bottom side than the tip side of the press-fit terminal 31. Alternatively, the cross-sectional area of the press-fit portion 32 in the plane perpendicular to the insertion direction of the press-fit terminal 31 increases from the bottom side toward the tip side of the press-fit terminal 31 and decreases toward the tip side after passing a certain point (inflection point).

In a case where the inflection point that changes the increase and decrease in the cross-sectional area is provided, the inflection point is located above top surfaces of the substrate supporting portions 51 on the top surface of the outer case 11 while the press-fit terminal 31 is buried in the outer case 11. After the external substrate 41 is mounted on the power semiconductor device, the inflection point is located in the through hole 44.

Further, an end portion on the bottom side of the opening 36, namely, the inner wall on the farthest bottom side of the opening 36 is located below the terminal-protecting-portion top surface 52a on the top surface of the outer case 11. This allows the press-fit terminal 31 to have spring characteristics. In this manner, a protruding margin of the press-fit terminal 31 from the top surface of the outer case 11 can be reduced. Thus, the outer shape of the power semiconductor device on which the external substrate 41 is mounted can be reduced.

The press-fit terminals 31 are surrounded by the terminal protecting portions 52 each having the terminal-protecting-portion top surface 52a and the terminal-protecting-portion side walls 52b. Thus, the terminal-protecting-portion side walls 52b can increase a creepage distance between the terminals. For this reason, a distance of the terminals between different electrodes can be shortened. In other words, the products can be reduced in size.

The terminal-protecting-portion top surface 52a is located so as to be sandwiched between the plurality of substrate supporting portions 51 in plan view. The groove portions 53 as the top surface of the outer case 11 are each located so as to be sandwiched between the plurality of terminal-protecting-portion top surfaces 52a in plan view.

The terminal-protecting-portion top surfaces 52a are approximately 1 mm lower than the height of the substrate supporting portions 51. The groove portions 53 as the top surface of the outer case 11 are approximately 4 mm lower than the height of the substrate supporting portions 51. The groove-portion width 53a is approximately 2.73 mm.

Figure 13:
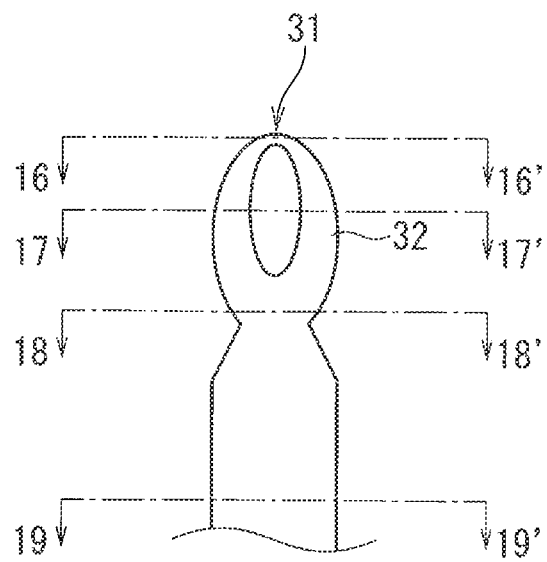
FIG. 13 is a front view illustrating a structure of a press-fit terminal without an inflection point.

FIG. 13 is a front view illustrating a structure of one of the press-fit terminals 31 without the inflection point. As illustrated in FIG. 13, a length in a width direction of the press-fit portion 32 (length in a horizontal direction in FIG. 13) decreases toward the tip side of the press-fit terminal 31. This structure can achieve the structure in which the cross-sectional area of the press-fit portion 32 in the plane perpendicular to the insertion direction of the press-fit terminal 31 is greater on the bottom side than the tip side of the press-fit terminal 31.

Figure 14:
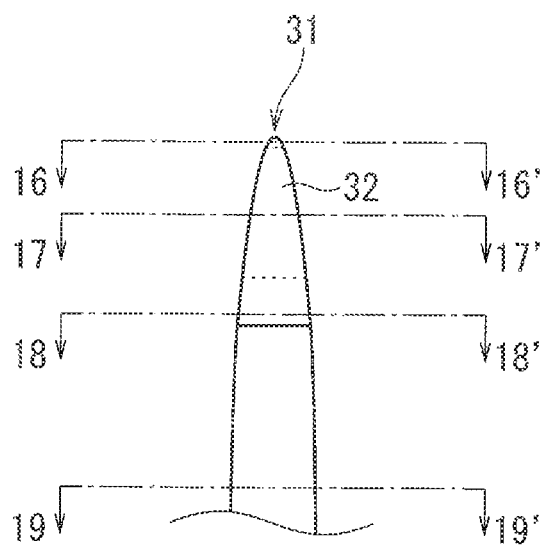
FIG. 14 is a side view illustrating the structure of the press-fit terminal without the inflection point.

FIG. 14 is a side view illustrating the structure of the press-fit terminal 31 without the inflection point. As illustrated in FIG. 14, a length in a thickness direction of the press-fit portion 32 (length in the horizontal direction in FIG. 14) decreases toward the tip side of the press-fit terminal 31. This structure can achieve the structure in which the cross-sectional area of the press-fit portion 32 in the plane perpendicular to the insertion direction of the press-fit terminal 31 is greater on the bottom side than the tip side of the press-fit terminal 31.

FIGS. 16-19, inclusive, illustrate top cross-sectional views of planes defined by lines 16-16', 17-17', 18-18' and 19-19', respectively, in FIGS. 13 and 14.

Action

The reasons for this structure are described below.

The dimension of the outer shape of the power semiconductor device is approximately several tens of millimeters to several hundreds of millimeters in general. The outer shape of the power semiconductor device is relatively great in size, thereby resulting in a great influence of manufacturing errors of members used for assembly. Thus, positions of the press-fit terminals need to allow the maximum amount of deviation of approximately 0.25 mm from a designed dimension. Furthermore, positions of the holes in the external substrate into which the press-fit terminals are inserted need to allow the maximum amount of deviation of approximately 0.1 mm. The deviations are added together, and the maximum amount of deviation of approximately 0.35 mm needs to be allowed.

The design allows for the relatively great deviation, so that the tips of the press-fit terminals may not be properly guided into the holes in the external substrate. When the press-fit terminals are not properly guided into the holes in the external substrate, the press-fit terminals may be buckled. In this case, the external circuit on the external substrate and the power semiconductor device fail to be electrically connected to each other.

Press-fit terminals in a wide allowable range of the above-mentioned deviation include press-fit terminals having a needle-eye shape. For the press-fit terminals having the needle-eye shape, the press-fit terminals preferably have a small thickness or a small width and preferably have a small cross-sectional area in a plane perpendicular to an insertion direction of the press-fit terminals in order to reduce a resistance (mainly, frictional resistance) when the press-fit terminals are inserted into the holes in the external substrate.

However, in a case where the power semiconductor device includes the press-fit terminals having the needle-eye shape, a current of approximately several tens of A needs to pass through the press-fit terminals, so that the cross-sectional area in the plane perpendicular to the insertion direction of the press-fit terminals is preferably increased from the viewpoint of suppressing a heating value.

In this preferred embodiment, for occurrence of manufacturing errors in the power semiconductor device or in the external substrate, the press-fit terminals 31 having the needle-eye shape are inserted into the through holes 44 in the external substrate 41, which allows the press-fit portions 32 and the through holes 44 to properly contact each other. This can achieve the power semiconductor device having high reliability.

In this preferred embodiment, the cross-sectional area of the press-fit portions 32 in the plane perpendicular to the insertion direction of the press-fit terminals 31 is small on the tip side, which can reduce the resistance (mainly, frictional resistance) when the press-fit terminals 31 are inserted into the through holes 44. This holds true for both cases in which the inflection point is provided and not provided.

The great cross-sectional area on the bottom side of the press-fit portions 32 increases heat capacity in a current-carrying path. Thus, a temperature rise caused by local heat generation can be suppressed. Therefore, an allowable current for one pin can be increased, and the number of pins used in the power semiconductor device can be reduced. Consequently, the power semiconductor device can be reduced in size. This holds true for both the cases in which the inflection point is provided and not provided.

Figure 11:
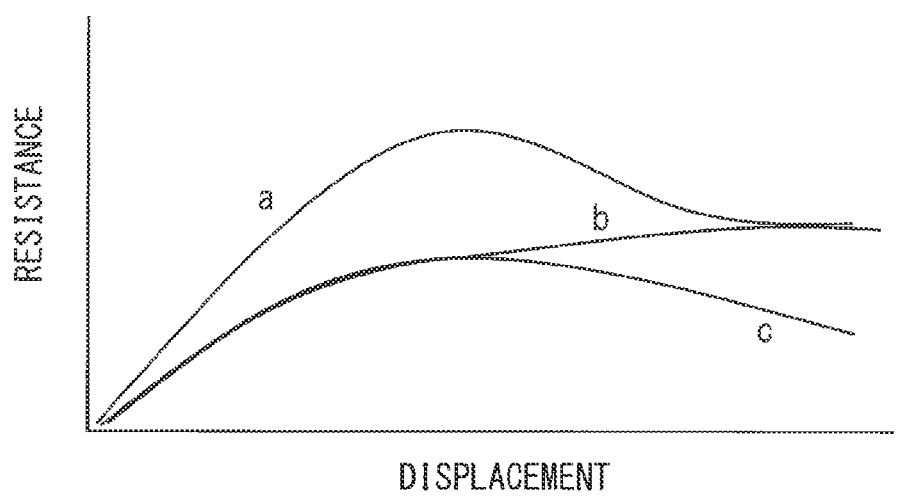
FIG. 11 illustrates a waveform of a resistance during an insertion of a press-fit terminal.

FIG. 11 illustrates a waveform of a resistance during an insertion of a press-fit terminal. In FIG. 11, a vertical axis represents an amount of resistance, and a horizontal axis represents an amount of displacement. In FIG. 11, a waveform "a" represents a case where a cross-sectional area of a press-fit portion is uniform in the insertion direction of the press-fit terminal and is relatively large. A waveform "b" represents a case of the press-fit portion 32 in this preferred embodiment. A waveform "c" represents a case where the cross-sectional area of the press-fit portion is uniform in the insertion direction of the press-fit terminal and is smaller than that in the case of the waveform "a". In addition, the resistance at completion of the insertion correlates with extraction force.

As illustrated in FIG. 11, the cross-sectional area of the press-fit portion is uniform and large, which increases the resistance at the start of the insertion similarly to the waveform "a." The increase in the resistance similarly to the waveform "a" increases an amount of deformation of the through holes 44, which increases a possibility of occurrence of a short between the through holes 44 adjacent to each other.

The cross-sectional area of the press-fit portion is uniform and small, which reduces the resistance at the start of the insertion similarly to the waveform "c." In the case of the waveform "c," however, the resistance at the completion of the insertion is also greatly reduced, which reduces force needed for extracting the press-fit terminal. Thus, the press-fit terminal is hardly fixed in the through hole in the external substrate.

The press-fit portion 32 in this preferred embodiment has the small cross-sectional area on the tip side of the press-fit portion 32 and has the great cross-sectional area on the bottom side of the press-fit portion 32. In the case where the inflection point is provided, the cross-sectional area in the certain range from the tip of the press-fit portion 32 is smaller than that on the bottom side of the press-fit portion 32. The press-fit portion 32 is formed in this manner, so that the increase in the resistance at the start of the insertion can be suppressed. Furthermore, the press-fit terminal 31 has high rigidity on the bottom side, and thus the force needed for extracting the press-fit terminal 31 is highly maintained after the press-fit terminal 31 is inserted into the through hole 44 in the external substrate 41. This prevents unintentional extraction of the press-fit terminal 31 due to influences of vibration or a load of temperature cycling.

Moreover, the cross-sectional area is increased toward the inflection point from the bottom side to the tip side of the press-fit terminal 31, so that the body portion 33 of the press-fit terminal 31 or the press-fit portion 32 close to the body portion 33 of the press-fit terminal 31 has a region having a small cross-sectional area. Thus, in a case where the position of the hole in the external substrate 41 is slightly misaligned with the position of the press-fit terminal 31, the region having the small cross-sectional area absorbs stress, and an allowable range of the misalignment can be expanded.

Various parts for controlling the power semiconductor device are soldered to the external substrate 41. Thus, a warp of approximately 200 µm may occur in the external substrate 41 before being mounted on the power semiconductor device.

In this preferred embodiment, in the case where the warp occurs in the external substrate 41 before being mounted on the power semiconductor device, the substrate supporting portions 51 and the terminal protecting portions 52 located on the top surface of the outer case 11 can absorb the warp in the external substrate 41.

In other words, the external substrate 41 that has been mounted contacts the substrate supporting portions 51, so that the substrate supporting portions 51 located around the four corners fix the external substrate 41 on the top surface of the outer case 11. Then, the warped external substrate 41 is housed in the gap in the height direction between the substrate supporting portions 51 and the terminal-protecting-portion top surfaces 52a.

In this manner, the warp in the external substrate 41 can be absorbed in the gap in the height direction between the substrate supporting portions 51 and the terminal-protecting-portion top surfaces 52a even in the case where the warp occurs in the external substrate 41 before being mounted on the power semiconductor device. This eliminates the need for compulsorily correcting the warp in the external substrate 41 before being mounted on the power semiconductor device, which can prevent damage to the parts on the external substrate 41 or damage to the soldered portions.

Moreover, at the occurrence of the load of the temperature cycling during the use of the power semiconductor device, the power semiconductor device and the external substrate 41 may sometimes be different from each other in the degree of expansion due to a mismatch between thermal expansion coefficients of structural members. However, in this preferred embodiment, the warp in the external substrate 41 can be absorbed in the manner above, which can suppress influences due to the difference in the degree of the expansion.

The groove portions 53 are located in the outer case 11, resulting in the following effects.

In the power semiconductor device, the press-fit terminals 31 including approximately 35 pins are used, for example, and each of the press-fit terminals 31 is inserted into the corresponding through hole 44 in the external substrate 41, one pin being under a load of approximately 50 N or more and approximately 100 N or less. Thus, the power semiconductor device as a whole under a high load of approximately 4000 N is installed on the external substrate 41.

As described above, the power semiconductor device is formed of the members having the various thermal expansion coefficients such as a copper base plate, IGBTs, and diode chips. Thus, an initial warp of a maximum of approximately 100 μm may occur after the power semiconductor device alone is manufactured.

The initial warp of the power semiconductor device is corrected by the high load when the power semiconductor device is installed on the external substrate 41. However, by providing the plurality of groove portions 53, the groove portions 53 can be preferentially deformed for the stress generated in the outer case 11 during the insertion of the press-fit terminals 31.

After the power semiconductor device is installed on the external substrate 41, the copper base plate 21 being the back surface of the power semiconductor device is installed on a heat sink (not illustrated herein), and the stress generated can also be relieved by the same action as that above. Furthermore, at the occurrence of the load of the temperature cycling, the deformation of the groove portions 53 can reduce the stress applied to the outer case 11.

The groove portions 53 can increase a creepage distance for insulation between the plurality of press-fit terminals 31, so that the power semiconductor device can be reduced in size.

Moreover, the terminal protecting portions 52 are located on the outer case 11, resulting in the following effects.

In other words, the creepage distance for insulation between the press-fit terminals 31 having different phases can be increased, so that the power semiconductor device can be reduced in size. The structure per se of the terminal protecting portions 52 can increase rigidity of the power semiconductor device.

When the power semiconductor device is installed on the external substrate 41, the warp of the power semiconductor device per se causes stress not only in a vertical direction (up-down direction in FIG. 3, for example) but also in a horizontal direction (perpendicular direction to the paper plane in FIG. 3, for example). As for the stress in the vertical direction, rigidity can be ensured by the copper base plate 21 on the bottom of the outer case 11. As for the stress in the horizontal direction, rigidity can be ensured by the terminal protecting portions 52.

In this manner, the number of press-fit terminals 31 that can be used in the power semiconductor device can be increased, and thus current that flows can be increased.

Space can be kept in the press-fit terminals 31 for obtaining the spring characteristics even in a case where the press-fit terminals 31 are inserted into the misaligned through holes 44. Meanwhile, the deformation of the press-fit terminals 31 or scratch on the press-fit terminals 31 due to external physical contact can be prevented.

This preferred embodiment shows the power semiconductor device having the inside sealed with epoxy resin. Power semiconductor devices having the inside sealed with gel and a lid being a top portion made of resin or power semiconductor devices in which the entire portions are transfer-molded are also similarly applicable.

The power semiconductor device in this preferred embodiment is illustrated with the structure including the terminals 100 that protrude from the top surface of the power semiconductor device. A structure including terminals 100*a* that protrude from side surfaces of a power semiconductor device, as illustrated in FIG. 12, is also similarly applicable.

Figure 12:
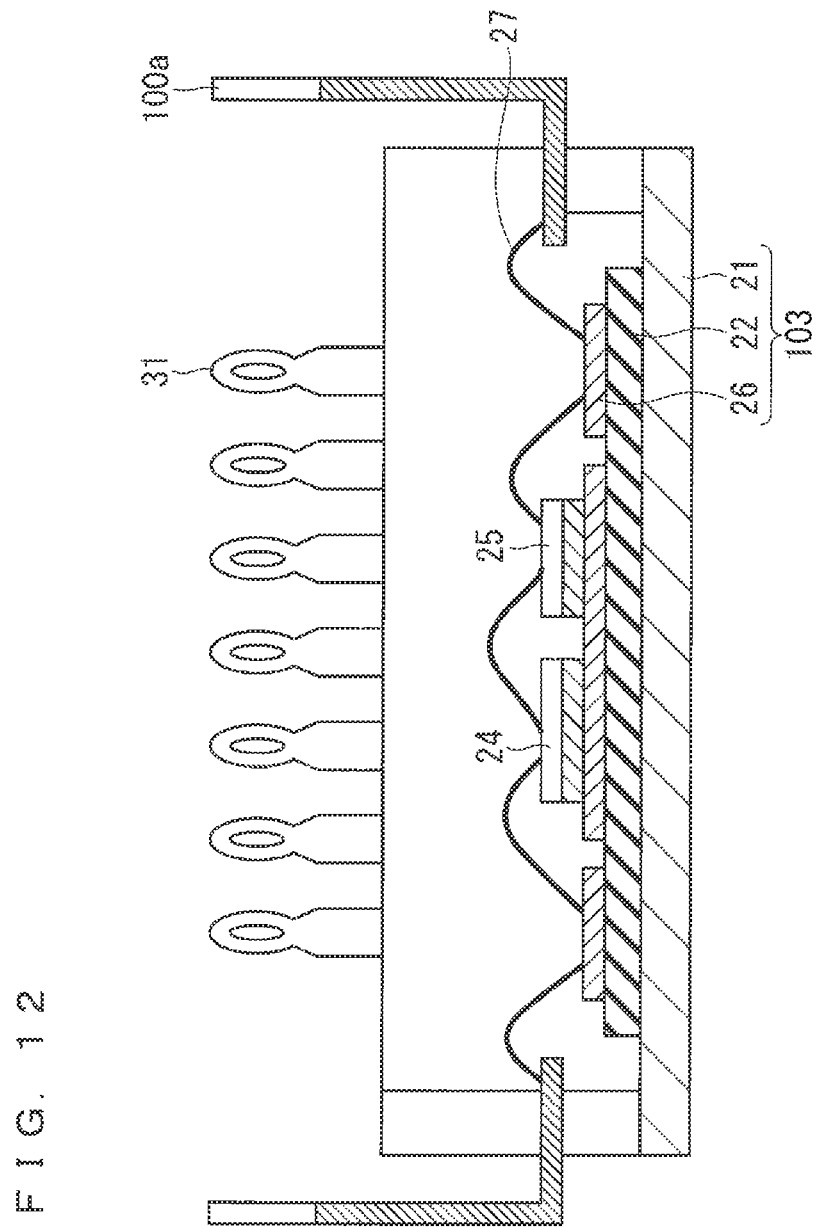
FIG. 12 is a front view illustrating an internal structure of a power semiconductor device in a modification.

In addition, FIG. 12 is a front view illustrating an internal structure of the power semiconductor device in a modification.

The power semiconductor device in this preferred embodiment is illustrated with the structure including the resin layer 22 as the insulating layer and the copper pattern 26 formed on the resin layer 22. However, a structure in which a material such as ceramic is used for the insulating layer or a structure including a copper base plate soldered below the ceramic to improve heat dissipation is also similarly applicable.

Effects

The effects of the preferred embodiment above are illustrated below.

In the preferred embodiment above, the power semiconductor device includes the outer case 11, at least the one press-fit terminal 31, and the substrate supporting portions 51 being a plurality of supporting portions.

The press-fit terminal 31 is buried in the top surface of the outer case 11. The substrate supporting portions 51 are formed so as to protrude from the top surface of the outer case 11.

The top end of the press-fit terminal 31 protrudes more than the top surfaces of the substrate supporting portions 51 from the top surface of the outer case 11.

With this structure, the external substrate 41 that has been mounted contacts the substrate supporting portions 52, so that the substrate supporting portions 51 located close to the four corners fix the external substrate 41 on the top surface of the outer case 11. Then, the warped external substrate 41 is housed in the gap in the height direction between the substrate supporting portions 51 and the terminal-protecting-portion top surfaces 52*a*. Thus, mechanical stress of the external substrate 41 applied to the power semiconductor device when the press-fit terminals 31 are inserted into the holes in the external substrate 41 can be suppressed.

The configurations except for those configurations can be omitted as appropriate. The effects above can be obtained in a case where at least one of the other configurations illustrated in this specification is added.

In the preferred embodiment above, the power semiconductor device includes the plurality of press-fit terminals 31 and the plurality of terminal protecting portions 52 being protecting portions formed so as to protrude from the top surface of the outer case 11.

The terminal protecting portions 52 are formed so as to at least partially surround the press-fit terminals 31 in plan view. The top surfaces of the substrate supporting portions 51 protrude more than the terminal-protecting-portion top surfaces 52*a* from the top surface of the outer case 11.

This configuration can efficiently ensure the creepage distance for insulation between the press-fit terminals. The outer case of the power semiconductor device does not need to be increased in size to ensure the creepage distance, which can reduce the power semiconductor device in size.

In the preferred embodiment above, the press-fit terminal 31 has the opening 36 penetrating in the direction perpendicular to the insertion direction of the press-fit terminal 31.

The terminal-protecting-portion top surfaces 52*a* are located so as to protrude more than a bottom end of the opening 36 from the top surface of the outer case 11.

With this configuration, the bottom end of the opening 36 does not protrude more than the terminal-protecting-portion top surfaces 52*a*, so that the margin of the press-fit terminal 31 from the external substrate 41 can be suppressed. Moreover, the power semiconductor device can be reduced in size.

In the preferred embodiment above, at least the one screw hole 13 is formed in the top surfaces of the substrate supporting portions 51.

This configuration can screw the external substrate 41 on the power semiconductor device, to thereby increase the reliability of fixing them together.

In the preferred embodiment above, the cross-sectional area in the plane perpendicular to the insertion direction of the press-fit terminal 31 is greater on the bottom side than the tip side of the press-fit terminal 31.

This configuration can reduce the resistance (mainly, frictional resistance) at the start of the insertion when the press-fit terminal 31 is inserted into the through hole 44 in the external substrate 41. The force needed for extracting the press-fit terminal 31 is highly maintained after the press-fit terminal 31 is inserted into the through hole 44 in the external substrate 41. This prevents the unintentional extraction of the press-fit terminal 31 due to the influences of the vibration or the load of the temperature cycling.

The cross-sectional area on the bottom side of the press-fit terminal 31 is great, which can suppress the temperature rise when large current flows.

In the preferred embodiment above, the cross-sectional area in the plane perpendicular to the insertion direction of the press-fit terminal 31 increases from the bottom side toward the tip side of the press-fit terminal 31 and decreases from the bottom side toward the tip side of the press-fit terminal 31 after passing the inflection point.

The inflection point is located so as to protrude more than the top surfaces of the substrate supporting portions 51 from the top surface of the outer case 11.

This configuration can reduce the resistance (mainly, frictional resistance) at the start of the insertion when the press-fit terminal 31 is inserted into the through hole 44 in the external substrate 41. The force needed for extracting the press-fit terminal 31 is highly maintained after the press-fit terminal 31 is inserted into the through hole 44 in the external substrate 41. This prevents the unintentional extraction of the press-fit terminal 31 due to the influences of the vibration or the load of the temperature cycling.

The cross-sectional area on the bottom side of the press-fit terminal 31 is great, which can suppress the temperature rise when the large current flows.

Modifications

Although the materials, the dimensions, the shapes, the relative positions of the respective structural components or the conditions of the implementation are described in the preferred embodiment above, the foregoing description is in all aspects illustrative and not restricted to the examples described in the specification. It is therefore understood the numerous modifications and variations can be devised within the scope of the invention. The modification of at least one structural component includes the addition or the omission, for example.

A position of a terminal in a power semiconductor device or a position of a hole in a substrate may be displaced due to an individual difference between parts or a manufacturing error in an assembly process. The manufacturing error in the assembly process is conceivably caused by, for example, contraction after filling with epoxy resin or a warp in the substrate after soldering.

When the press-fit terminal is inserted into the hole with a high degree of the above-mentioned displacement, the press-fit portion 32 is plastically deformed, which may increase contact resistance.

Figure 15:
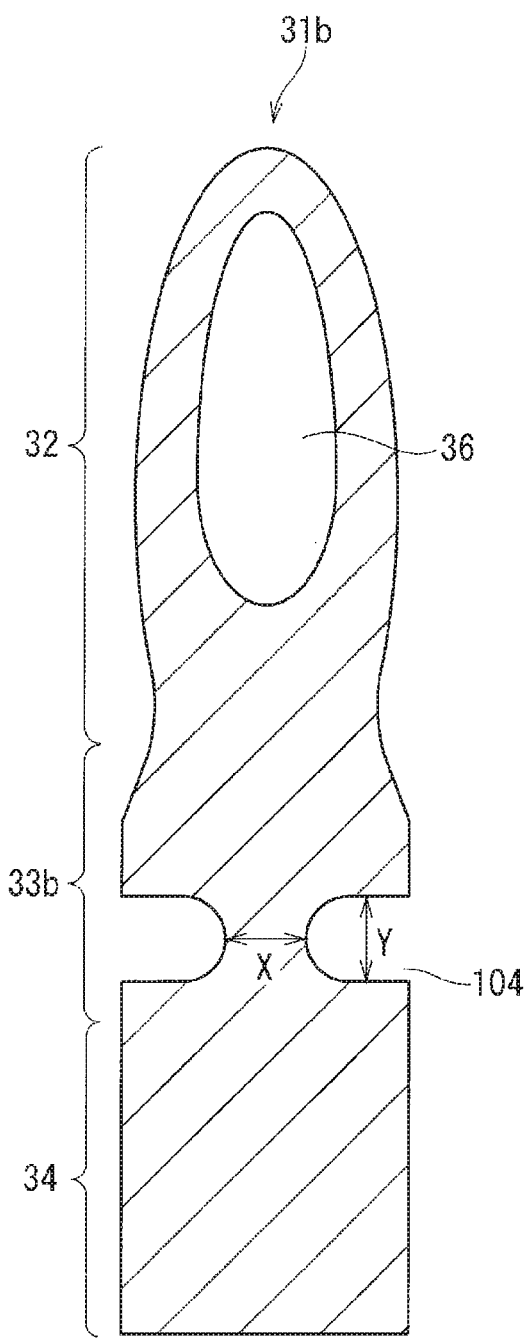
FIG. 15 is a side view illustrating a structure of a press-fit terminal having a constricted portion.
Figure 16:
FIG. 16 is a top cross-sectional view of a plane defined by line 16-16' in FIGS. 13 and 14.
Figure 17:
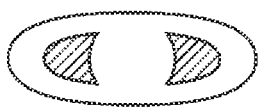
FIG. 17 is a top cross-sectional view of a plane defined by line 17-17' in FIGS. 13 and 14.
Figure 18:
FIG. 18 is a top cross-sectional view of a plane defined by line 18-18' in FIGS. 13 and 14.
Figure 19:
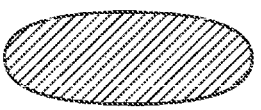
FIG. 19 is a top cross-sectional view of a plane defined by line 19-19' in FIGS. 13 and 14.

In such a case, for example, as illustrated in FIG. 15, a press-fit terminal 31b may have a constricted portion 104 in a body portion 33b. FIG. 15 is a side view illustrating the structure of the press-fit terminal having the constricted portion.

Herein, the constricted portion 104 is a portion having a recessed portion continuously circumferentially formed in the body portion 33b of the press-fit terminal 31b. Therefore, the constricted portion 104 has a width in a direction perpendicular to an insertion direction of the press-fit terminal 31b smaller than a width of another portion of the body portion 33b.

Such a structure gives high priority to the deformation of the constricted portion 104, which can suppress the plastic deformation of the press-fit portion 32. Therefore, an increase in contact resistance when the press-fit terminal 31b is inserted into the through hole 44 in the external substrate 41 can be suppressed. Moreover, reliability of the press-fit terminal 31b can be increased.

In addition, a shape of a section of the constricted portion 104 perpendicular to the insertion direction of the press-fit terminal 31b is preferably a circular arc shape or an elliptical shape.

In this case, a diameter (X in FIG. 15) of the section of the constricted portion 104 perpendicular to the insertion direction of the press-fit terminal 31b may be set to a plate thickness of the press-fit terminal 31b, which is greater than or equal to 0.8 mm, for example, in terms of buckling of the constricted portion 104 and temperature rise due to heat generation by the passage of electric current.

The above-mentioned effects are hardly obtained if the diameter (X in FIG. 15) of the section of the constricted portion 104 perpendicular to the insertion direction of the press-fit terminal 31b is too large. Thus, the diameter may be less than or equal to 1.4 mm, for example.

The recessed portion continuously circumferentially formed in the constricted portion 104 may have a width (Y in FIG. 15) in the insertion direction of the press-fit terminal 31b set to be less than or equal to 1 mm to give high priority to the deformation of the constricted portion 104.

"One" structural component described in the preferred embodiment above may include "more than one" as long as no contradiction arises. Further, each of the structural components in the conceptual unit includes one structural component formed of a plurality of structures, one structural component corresponding to part of a structure, and a plurality of structural components included in one structure. As long as the same functions are obtained, each of the structural components includes structures having another structure or another shape.

The descriptions in the specification are referred to for all purposes of this technology, and any of them are not recognized as the conventional technologies.

When materials are described without specifications of their names in the preferred embodiment above, the materials are assumed to include the other additives, for example, alloys, as long as no contradiction arises.

While the invention has been shown and described in detail, the foregoing description is in all aspects illustrative and not restrictive. It is therefore understood that numerous modifications and variations can be devised without departing from the scope of the invention.

What is claimed is:

1. A power semiconductor device, comprising:
   an outer case;
   at least one press-fit terminal buried in a top surface of said outer case;
   a plurality of supporting portions formed so as to protrude from the top surface of said outer case;
   a plurality of said press-fit terminals; and
   a plurality of protecting portions formed so as to protrude from the top surface of said outer case, wherein
   a top end of said press-fit terminal protrudes more than top surfaces of said supporting portions from the top surface of said outer case,
   each of said protecting portions is formed so as to at least partially surround said corresponding press-fit terminal in plan view, and
   the top surfaces of said supporting portions protrude more than a top surface of each of said protecting portions from the top surface of said outer case.

2. The power semiconductor device according to claim 1, further comprising:
   a plurality of press-fit terminals buried in a top surface of said outer case, said plurality of press-fit terminals positioned adjacent to one another in a direction perpendicular to an insertion direction of said press-fit terminal;
   a first groove portion formed in the top surface of said outer case on one side of the plurality of press-fit terminals; and
   a second groove portion formed in the top surface of said outer case on an opposite side of the plurality of press-fit terminals,
   wherein said first and second groove portions extend transverse to said direction perpendicular to said insertion direction of said press-fit terminal.

3. The power semiconductor device according to claim 1, wherein
   said press-fit terminals each have an opening penetrating in a direction perpendicular to an insertion direction of said press-fit terminal, and
   the top surface of each of said protecting portions is located so as to protrude more than a bottom end of said opening from the top surface of said outer case.

4. The power semiconductor device according to claim 1, wherein
   at least one screw hole is formed in the top surfaces of said supporting portions.

5. The power semiconductor device according to claim 1, wherein
   a first cross-sectional area in a first plane perpendicular to an insertion direction of said press-fit terminal on a bottom side of said press-fit terminal is greater than a second cross-sectional area in a second plane perpendicular to the insertion direction of said press-fit terminal on a tip side of said press-fit terminal.

6. The power semiconductor device according to claim 1, wherein
   a first cross-sectional area in a first plane perpendicular to an insertion direction of said press-fit terminal increases from a bottom side toward a tip side of said press-fit terminal and a second cross-sectional area in a second plane perpendicular to the insertion direction of said press-fit terminal decreases toward the tip side of said press-fit terminal after passing an inflection point, and
   said inflection point is located so as to protrude more than the top surfaces of said supporting portions from the top surface of said outer case.

7. The power semiconductor device according to claim 3, further comprising a constricted portion provided on a bottom side below said opening of said press-fit terminal,
   wherein said constricted portion has a width in a direction perpendicular to the insertion direction of said press-fit terminal smaller than a width of another portion of said press-fit terminal.

8. The power semiconductor device according to claim 7, wherein a shape of a section of said constricted portion perpendicular to the insertion direction of said press-fit terminal is a circular arc shape or an elliptical shape.

* * * * *